(12) United States Patent
Kolar et al.

(10) Patent No.: US 11,967,394 B2
(45) Date of Patent: Apr. 23, 2024

(54) MEMORY ARRAYS EMPLOYING FLYING BIT LINES TO INCREASE EFFECTIVE BIT LINE LENGTH FOR SUPPORTING HIGHER PERFORMANCE, INCREASED MEMORY DENSITY, AND RELATED METHODS

(71) Applicant: Microsoft Technology Licensing, LLC, Redmond, WA (US)

(72) Inventors: Pramod Kolar, Cary, NC (US); Robert A. Sweitzer, Cary, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 135 days.

(21) Appl. No.: 17/836,634

(22) Filed: Jun. 9, 2022

(65) Prior Publication Data

US 2023/0402069 A1    Dec. 14, 2023

(51) Int. Cl.
| | | |
|---|---|---|
| *G11C 13/00* | (2006.01) | |
| *G11C 7/06* | (2006.01) | |
| *G11C 7/10* | (2006.01) | |
| *G11C 7/12* | (2006.01) | |
| *G11C 8/08* | (2006.01) | |

(52) U.S. Cl.
CPC ............. *G11C 7/06* (2013.01); *G11C 7/1012* (2013.01); *G11C 7/1063* (2013.01); *G11C 7/12* (2013.01); *G11C 8/08* (2013.01); *G11C 13/00* (2013.01)

(58) Field of Classification Search
CPC .................................................. G11C 13/0069
See application file for complete search history.

(56) References Cited

U.S. PATENT DOCUMENTS

| 11,055,011 B2 * | 7/2021 | Kim .................... G06F 3/061 |
| 2015/0121030 A1 | 4/2015 | Lin et al. |
| 2015/0348594 A1 | 12/2015 | Patel et al. |
| 2020/0251164 A1 | 8/2020 | Pulluru et al. |

OTHER PUBLICATIONS

"International Search Report and Written Opinion Issued in PCT Application No. PCT/US23/019031", dated Jul. 10, 2023, 14 Pages.

* cited by examiner

*Primary Examiner* — Jason Lappas
(74) *Attorney, Agent, or Firm* — Withrow & Terranova, PLLC

(57) ABSTRACT

Memory arrays employing flying bit lines to increase effective bit line length for supporting higher performance, increased memory density, and related methods. To increase memory density, the memory array has a first memory sub-bank and one or more second memory sub-banks. The first memory sub-bank includes a first bit line(s) for each of its memory column circuits. To avoid the need to extend the length of the first bit lines to be coupled to the second memory bit cells in the second memory sub-bank, each memory sub-bank has its own dedicated first and second bit lines coupling their respective memory bit cells to access circuitry. The second bit lines effectively "fly" independent of the first bit lines of the first memory sub-bank. The first bit lines of the first memory sub-bank do not have to be extended in length to provide bit lines for the second memory sub-bank.

19 Claims, 7 Drawing Sheets

MEMORY ARRAYS EMPLOYING FLYING BIT LINES TO INCREASE EFFECTIVE BIT LINE LENGTH FOR SUPPORTING HIGHER PERFORMANCE, INCREASED MEMORY DENSITY, AND RELATED METHODS

FIELD OF THE DISCLOSURE

The technology of the disclosure relates to computer memory systems, and more particularly to memory arrays that are implemented with multiple memory banks to improve memory performance and power consumption.

BACKGROUND

Processor-based systems including memory systems that support read and write operations. Memory may be used for data storage and as well as to store program code for storing instructions to be executed. Such processor-based systems conventionally employ both cache and non-cache memory, sometimes referred to as "main memory" or "system memory." For example, a CPU in the processor-based system may have access to an on-chip local, private cache memory. Multiple CPUs in a processor-based system may also have access to a shared cache memory. The processor-based system also employs a main or system memory that contains memory storage units (i.e., memory bit cells) over the entire physical address space of the processor-based system. Each of these different types of memories employ memory arrays that include memory bit cells typically organized in a row and column structure for storing data. A memory row that contains a memory bit cell in a respective column is accessed to read or write a data word from memory. The memory bit cells can be provided in different technologies of memory, such as static random access memory (RAM) (SRAM) bit cells, and dynamic RAM (DRAM) bit cells.

It is becoming increasingly important to be able to provide larger density memory arrays in cache memories in processor-based systems. This is so that memory accesses have a better chance of being supplied from the cache memory instead of longer latency accesses to system memory. However, larger cache memories may degrade power, performance, and area (PPA). Larger cache memories consume more semiconductor die area than smaller cache memories employing the same memory bit cell technology. Larger cache memories may also have increased access latency as compared to smaller cache memories, because column bit lines that are coupled the supporting access circuitry (e.g., write driver circuits and read sense circuits), are extended in length to reach the extended areas of the memory array. Thus, the overall memory access latency may increase by the access time to the memory bit cells located farthest away from the supporting access circuitry. Also, larger cache memories may have increased cache latency due to providing longer length bit lines to reach the increased number of memory bit cells coupled to the bit lines. This increases the capacitance on the bit lines thus increasing access latency. Fabrication design rules and related fabrication processes may also limit the overall length of bit lines in memory arrays thus effectively limiting the density of memory arrays regardless of tradeoff acceptance of increased access latency.

SUMMARY

Exemplary aspects disclosed herein include memory arrays employing flying bit lines to increase effective bit line length for supporting higher performance, and increased memory density. Related methods are also disclosed. In exemplary aspects, to increase the density of the memory array over providing the memory capacity of one memory sub-bank, the memory array includes a first memory sub-bank and one or more second memory sub-banks. In one example, the first memory sub-bank is located physically closer to the supporting access circuitry than the second memory sub-bank(s). The first memory sub-bank includes a first bit line(s) for each of its first memory column circuits. The first bit line(s) couples first memory bit cells in its respective first memory column circuit in the first memory sub-bank to access circuitry (e.g., column multiplexer circuits, read sense circuits). To avoid the need to extend the length of the first bit lines to be coupled to the second memory sub-bank that could increase access latency, the second memory sub-bank includes a separate, second bit line(s). In this manner, each memory sub-bank has its own dedicated first and second bit lines coupling their respective memory bit cells to the access circuitry. The second bit lines of the second memory sub-bank effectively "fly" independent of the first bit lines of the first memory sub-bank, wherein the second bit lines are independently coupled to the access circuitry. The first bit lines of the first memory sub-bank do not have to be extended in length to provide bit lines for the second memory sub-bank. In this manner, the increased memory density does not have to come at an increased latency access cost due higher bit line capacitance, higher dynamic energy consumption, and/or violation of fabrication design rules that may limit memory density. The memory density could also be increased based on the latency access savings without sacrificing power consumption. Also, in another example, by the first and second memory sub-banks not sharing bit lines but sharing access circuitry, the first and second memory sub-banks are not accessed at the same time for memory operations to avoid conflicts in the shared access circuitry. However, the memory accesses to the different memory sub-banks are managed to then benefit from the increased memory density without having to extend bit line lengths in the first memory sub-bank.

In another example, it is desired to avoid the need for the cell circuits of the first memory bit cells in the first memory sub-array to support a separate metal line path for the second bit lines to extend therethrough towards the access circuitry. In this regard, the cell circuits of the first memory bit cells in the memory row circuit of the first memory sub-bank adjacent to the second memory sub-bank are provided as flying bit line cell circuits. The flying bit line cell circuit is a dedicated cell circuit that not only includes the first memory bit cell and metal lines for the first bit lines, but also includes a jumper circuit. The jumper circuit extends a coupled second bit line from an adjacent memory bit cell row in the second memory sub-bank to a different metal layer. The second bit line is then extended in this different metal layer that "flys over" the first memory sub-bank to the access circuitry. In this manner, the flying bit line cell circuits facilitate extending the coupled second bit lines of the second memory sub-bank to the access circuitry without the second bit lines being coupled to the first bit lines in the first memory sub-bank, which would extend the length of the first bit lines. Extending the length of bit lines in a memory array may increase memory access latency to the memory array. Further, providing the flying bit lines avoids the need for each first memory row circuit in the first memory sub-bank to support separate metal lines for the second metal lines to pass through the first memory sub-bank to the access circuitry, which may violate design fabrication rules for example.

In this regard, in one exemplary aspect, a memory system is provided. The memory system includes a memory column access circuit. The memory system also includes a memory array. The memory array includes a first metal layer, and a second metal layer different from the first metal layer, the second metal layer comprising a plurality of flying bit lines each coupled to the memory column access circuit. The memory system also includes a first memory sub-bank that comprising a plurality of first memory row circuits each comprising a plurality of first memory bit cell circuits each located in a respective first memory column circuit of a plurality of first memory column circuits. The first memory sub-bank also includes a plurality of first bit lines disposed in the first metal layer and each coupled to a first memory column circuit of the plurality of first memory column circuits, and the memory column access circuit. The memory array also includes a second memory sub-bank that comprises a plurality of second memory row circuits each comprising a plurality of second memory bit cell circuits each located in a respective second memory column circuit of a plurality of second memory column circuits. The second memory sub-bank also includes a plurality of second bit lines each disposed in the first metal layer and each coupled to a second memory column circuit of the plurality of second memory column circuits. The memory array also includes a first jumper row circuit comprising a plurality of first jumper cell circuits each coupled to a second bit line of the plurality of second bit lines in a second memory column circuit of the plurality of second memory column circuits in the first metal layer, and a first flying bit line of the plurality of first flying bit lines in the second metal layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 3:
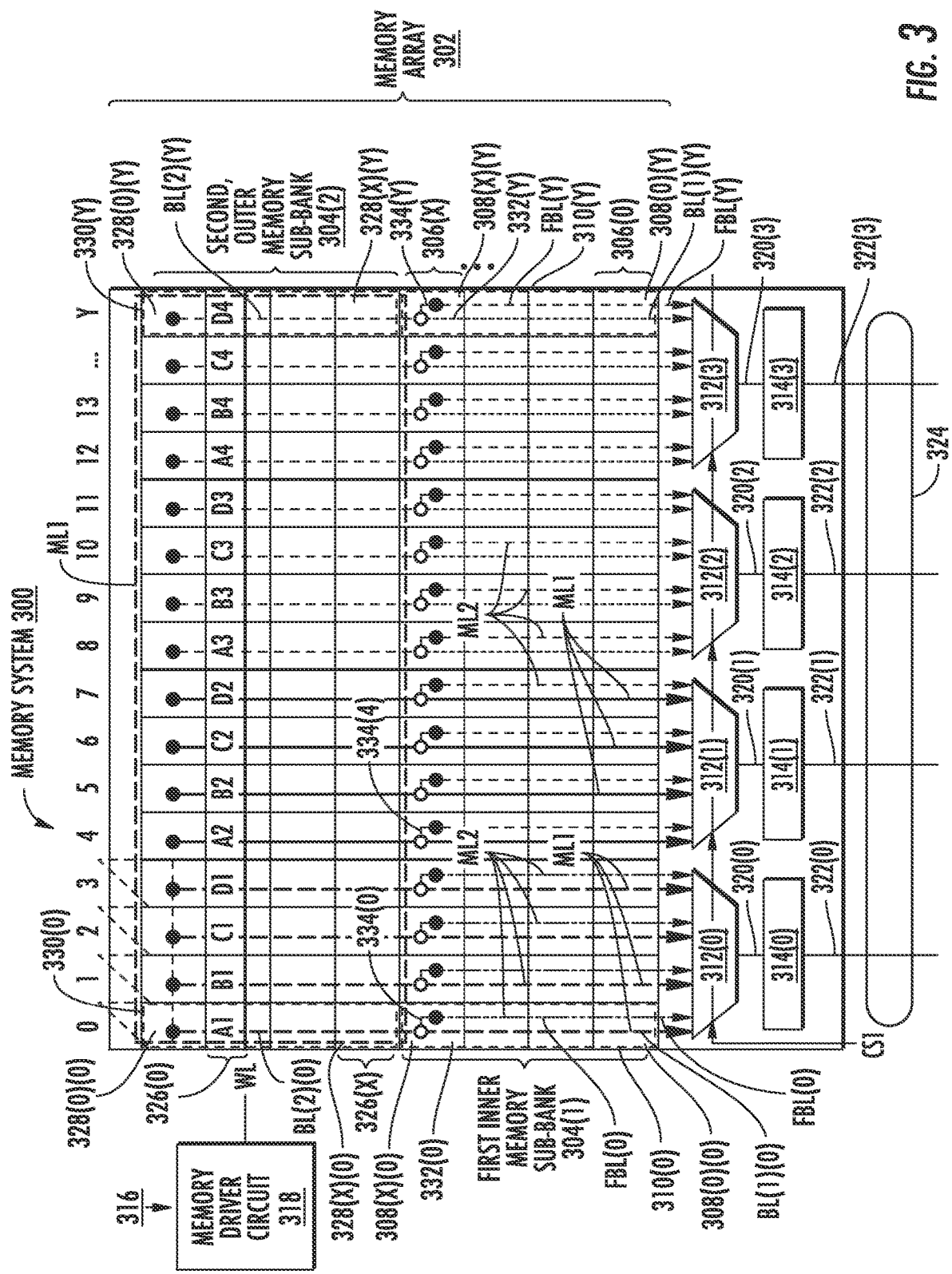
Figure 4A:
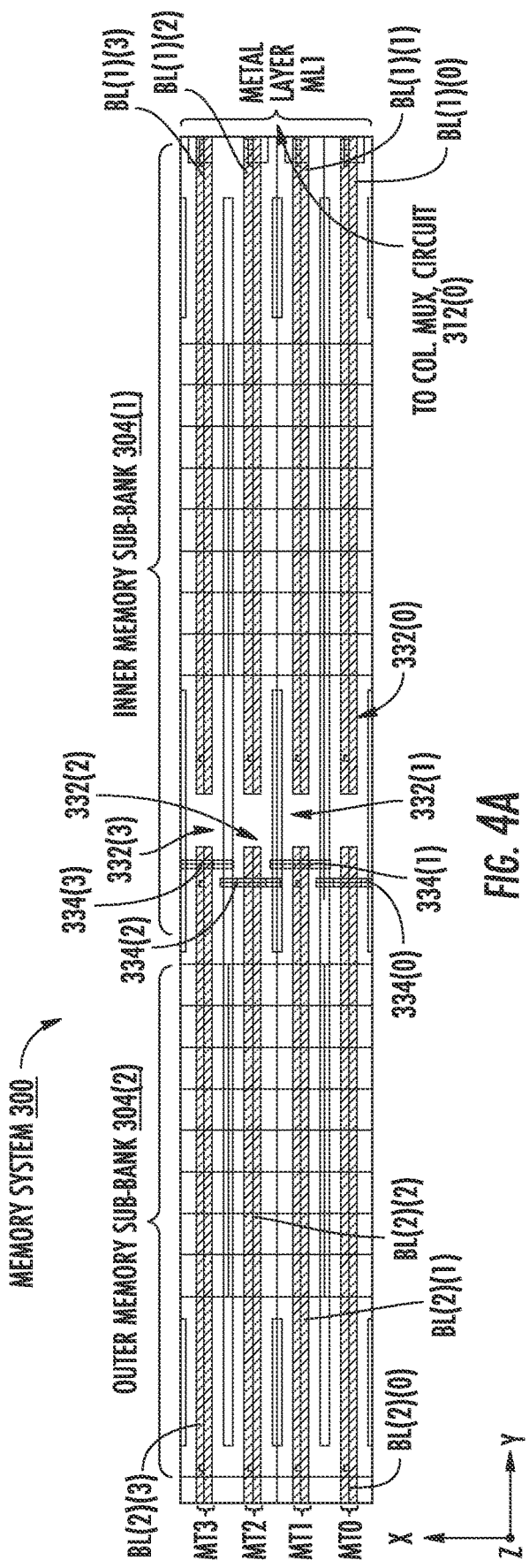
Figure 4B:
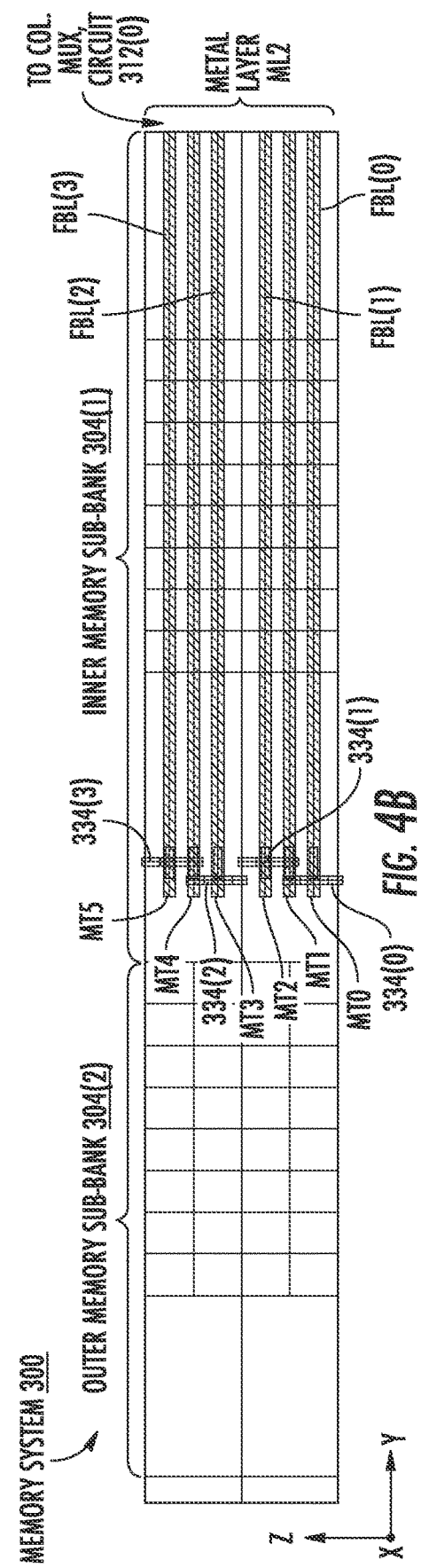
Figure 5:
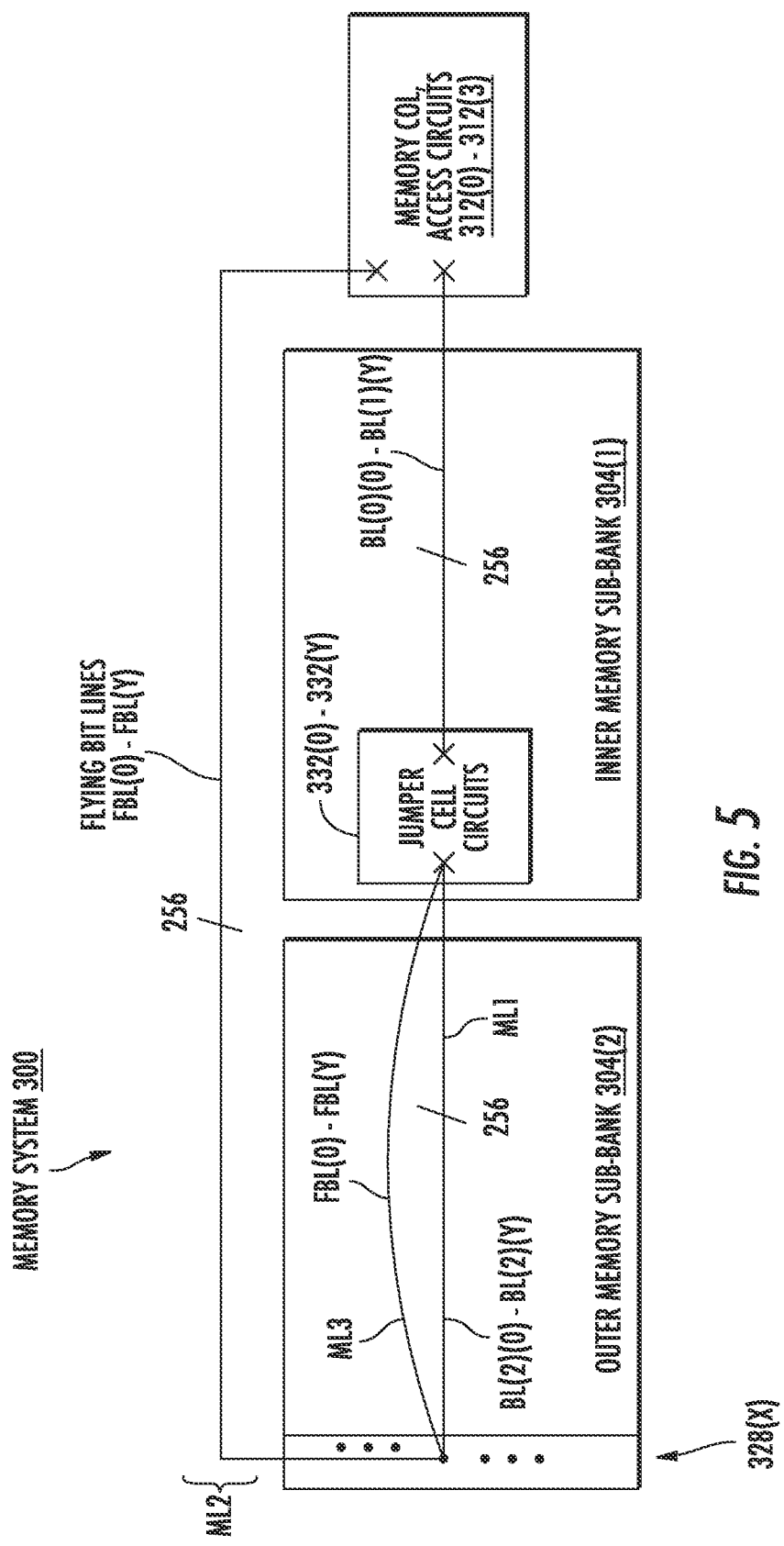
Figure 6:
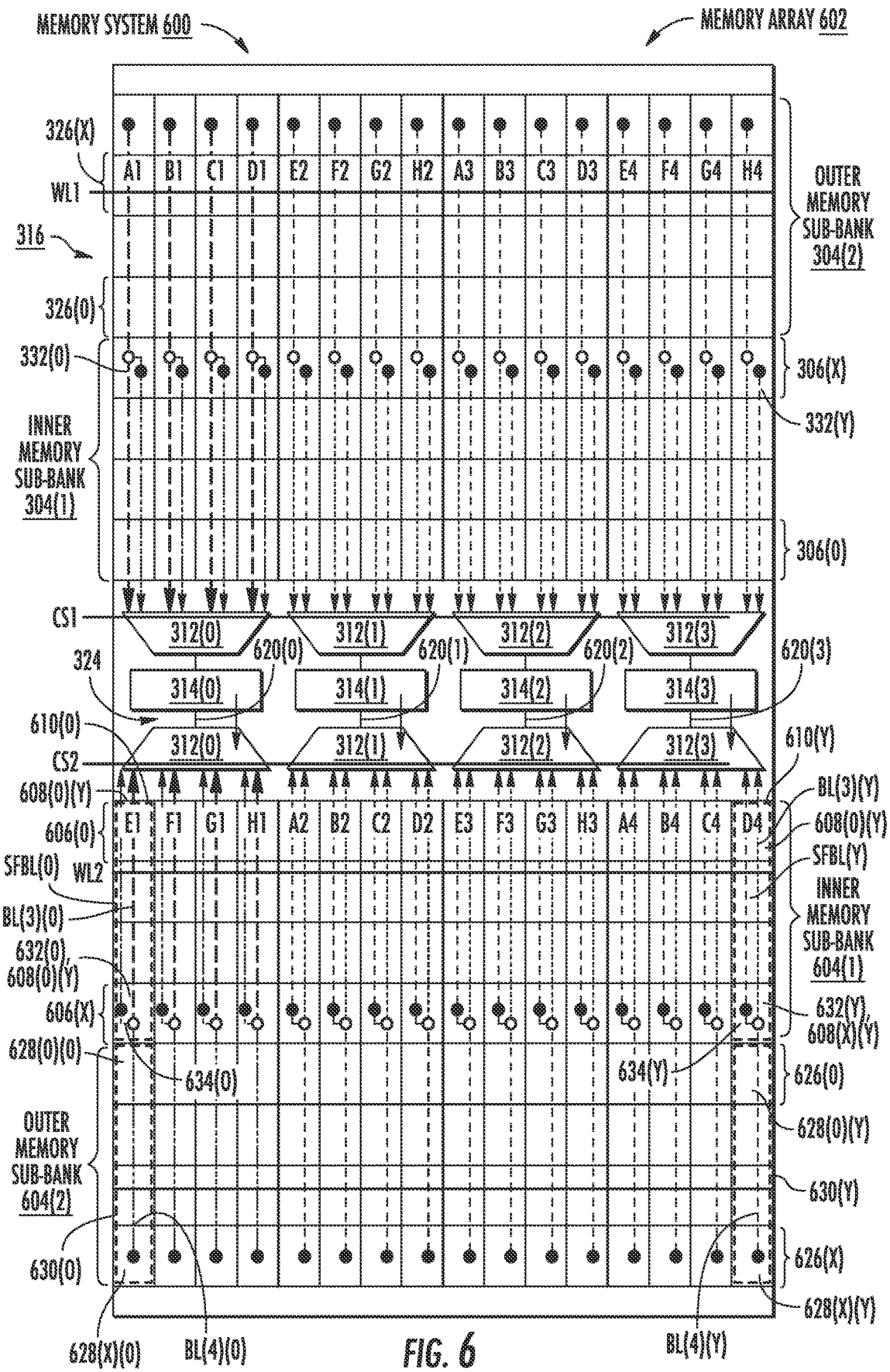
Figure 7:
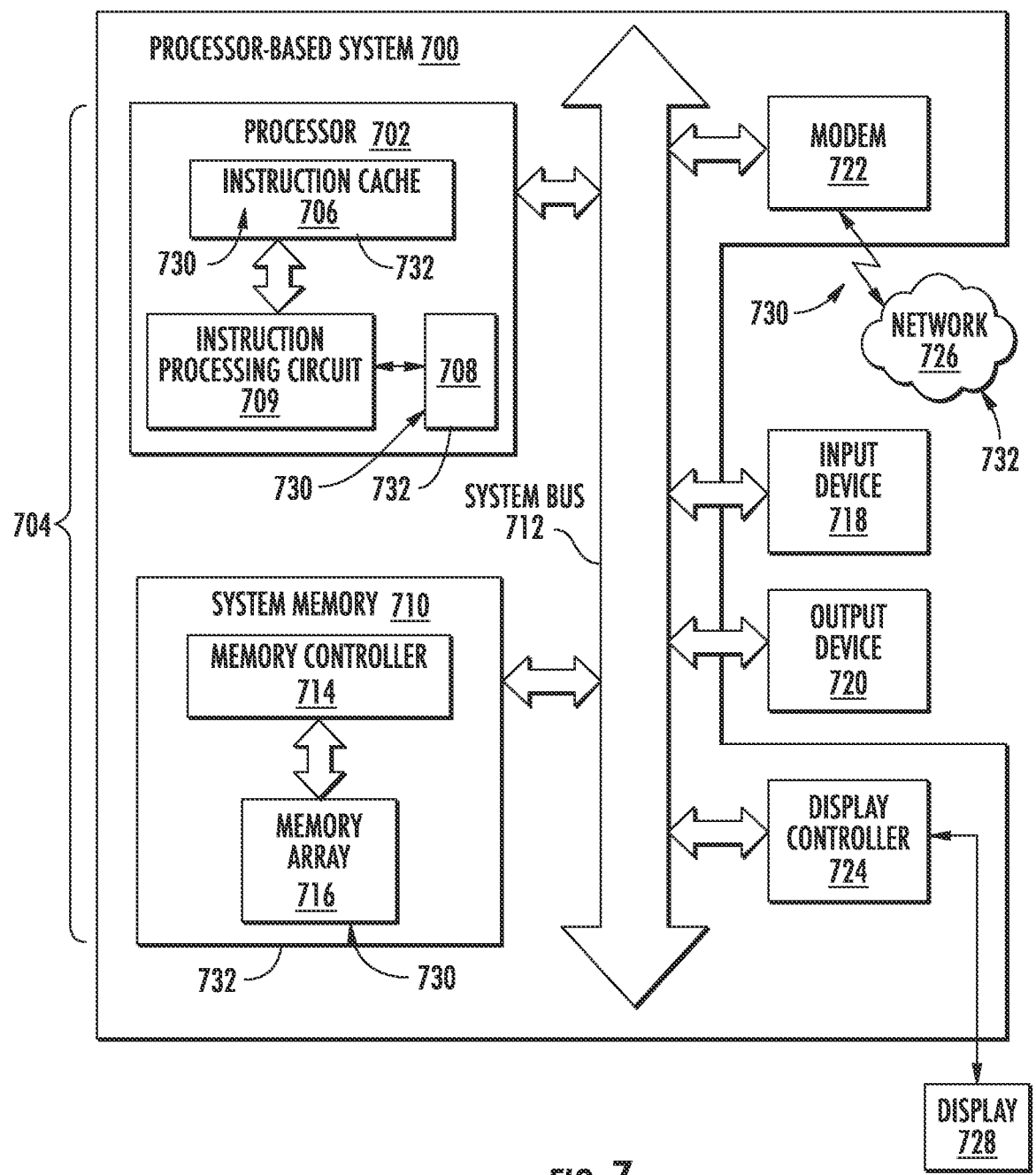

FIG. 3 is an exemplary memory system in an exemplary CM4 interleave arrangement that includes a memory array with increased memory density, and wherein the memory array further includes flying bit lines coupling access circuitry to second bit lines in the second memory sub-bank to increase effective bit line length for supporting higher performance, without having to extend the length of first bit lines in the first memory sub-array;

FIG. 4A is a top view of an exemplary layout of a lower metal layer in the memory array in FIG. 3 illustrating metal lines of first bit lines of the first memory sub-bank extending to coupled access circuitry, and metal lines of second bit lines of the second memory sub-bank extending to a jumper area in the lower metal layer;

FIG. 4B is a top view of an exemplary layout of an upper metal layer in the memory array in FIG. 3 illustrating metal lines of flying bit lines jumpered to the second bit lines of the second memory sub-bank in the lower metal layer in FIG. 4A, wherein the flying bit lines extend to coupled access circuitry;

FIG. 5 is a top view of another exemplary layout of illustrating metal lines of flying bit lines in an upper metal layer jumpered to the second bit lines of the second memory sub-bank in a lower metal layer;

FIG. 6 is another exemplary memory system in an eight (8) column multiplexed (CM8) arrangement, wherein the memory system includes a memory array that includes a first and second memory sub-banks to increase memory density, and wherein the memory array further includes flying bit lines coupling access circuitry to second bit lines in the second memory sub-bank to increase effective bit line length for supporting higher performance, without having to extend the length of first bit lines in the first memory sub-array; and FIG. 7 is a block diagram of an exemplary processor-based system that can be provided in an integrated circuit (IC) chip, wherein the processor-based system includes a processor and a memory system that includes a memory array including a first and second memory sub-banks to increase memory density, and wherein the memory array further includes flying bit lines coupling access circuitry to second bit lines in the second memory sub-bank to increase effective bit line length for supporting higher performance, without having to extend the length of first bit lines in the first memory sub-array, including, without limitation, the memory systems in FIGS. 3 and 6.

DETAILED DESCRIPTION

Exemplary aspects disclosed herein include memory arrays employing flying bit lines to increase effective bit line length for supporting higher performance, and increased memory density. Related methods are also disclosed. In exemplary aspects, to increase the density of the memory array over providing the memory capacity of one memory sub-bank, the memory array includes a first memory sub-bank and one or more second memory sub-banks. In one example, the first memory sub-bank is located physically closer to the supporting access circuitry than the second memory sub-bank(s). The first memory sub-bank includes a first bit line(s) for each of its first memory column circuits. The first bit line(s) couples first memory bit cells in its respective first memory column circuit in the first memory sub-bank to access circuitry (e.g., column multiplexer circuits, read sense circuits). To avoid the need to extend the length of the first bit lines to be coupled to the second memory sub-bank that could increase access latency, the second memory sub-bank includes a separate, second bit line(s). In this manner, each memory sub-bank has its own dedicated first and second bit lines coupling their respective memory bit cells to the access circuitry. The second bit lines of the second memory sub-bank effectively "fly" independent of the first bit lines of the first memory sub-bank, wherein the second bit lines are independently coupled to the access circuitry. The first bit lines of the first memory sub-bank do not have to be extended in length to provide bit lines for the second memory sub-bank. In this manner, the increased memory density does not have to come at an increased latency access cost due higher bit line capacitance, higher dynamic energy consumption, and/or violation of fabrication design rules that may limit memory density. The memory density could also be increased based on the latency access savings without sacrificing power consumption. Also, in another example, by the first and second memory sub-banks not sharing bit lines but sharing access circuitry, the first and second memory sub-banks are not accessed at the same time for memory operations to avoid conflicts in the shared access circuitry. However, the memory accesses to the different memory sub-banks are managed to then benefit from the increased memory density without having to extend bit line lengths in the first memory sub-bank.

In another example, it is desired to avoid the need for the cell circuits of the first memory bit cells in the first memory sub-array to support a separate metal line path for the second bit lines to extend therethrough towards the access circuitry. In this regard, the cell circuits of the first memory bit cells in the memory row circuit of the first memory sub-bank adjacent to the second memory sub-bank are provided as flying bit line cell circuits. The flying bit line cell circuit is a dedicated cell circuit that not only includes the first memory bit cell and metal lines for the first bit lines, but also includes a jumper circuit. The jumper circuit extends a coupled second bit line from an adjacent memory bit cell row in the second memory sub-bank to a different metal layer. The second bit line is then extended in this different metal layer that "flys over" the first memory sub-bank towards to the access circuitry. In this manner, the flying bit line cell circuits facilitate extending the coupled second bit lines of the second memory sub-bank to the access circuitry without the second bit lines being coupled to the first bit lines in the first memory sub-bank, which would extend the length of the first bit lines. Extending the length of bit lines in a memory array may increase memory access latency to the memory array. Further, providing the flying bit lines avoid the need for each first memory row circuit in the first memory sub-bank to support separate metal lines for the second metal lines to pass through the first memory sub-bank to the access circuitry, which may violate design fabrication rules for example.

Figure 1:
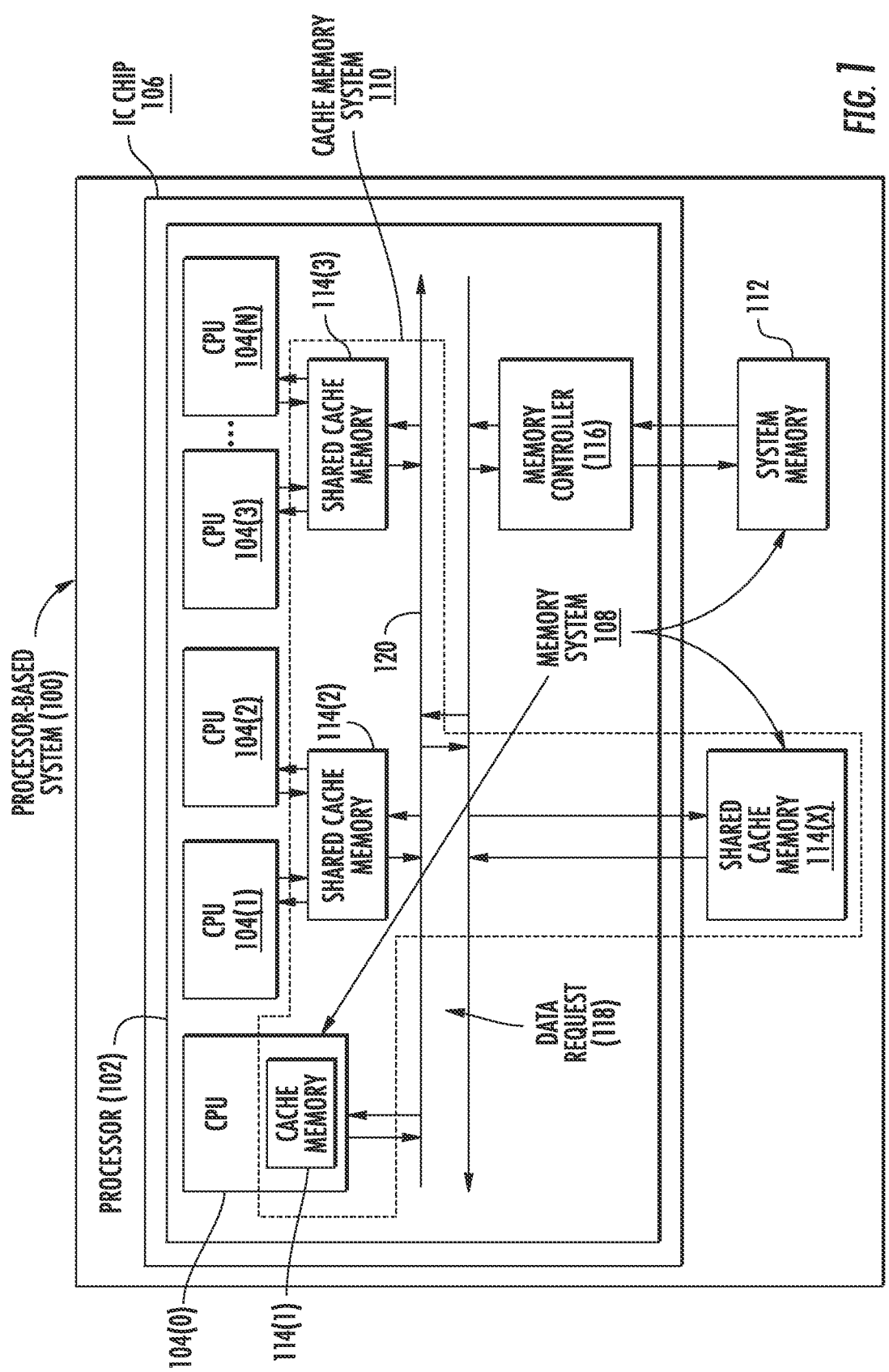
FIG. 1 is an exemplary processor-based system that includes a plurality of central processing units (CPUs) each configured to access local and shared cache memory, and system memory to read and write data.

In this regard, FIG. 1 is a diagram of an exemplary processor-based system 100 that includes a processor 102 and a memory system 108. As discussed in more detail below, the memory system 108 can include memory arrays that include flying bit lines coupling access circuitry to second bit lines in a second memory sub-bank to increase effective bit line length for supporting higher performance. Before such exemplary memory arrays are discussed, the exemplary processor-based system 100 and its components is first discussed below.

With continuing reference to FIG. 1, the processor 102 includes one or more respective CPUs 104(0)-104(N), wherein 'N' is a positive whole number representing the number of CPUs included in the processor 102. The processor 102 can be packaged in an integrated circuit (IC) chip 106. The CPUs 104(0)-104(N) in the processor 102 are configured to issue memory requests (i.e., data read and data write requests) to a memory system 108. The memory system 108 includes a cache memory system 110 and a system memory 112. The system memory 112 is a memory that is fully addressable by the physical address (PA) space of the processor-based system 100. For example, the system memory 112 may be a dynamic random access memory (DRAM) provided in a separate DRAM chip. The cache memory system 110 in the memory system 108 includes one or more cache memories 114(1)-114(X), where 'X' is a positive whole number representing the number of cache memories included in the processor 102. The cache memories 114(1)-114(X) may be at different hierarchies in the processor-based system 100 and are logically located between the CPUs 104(0)-104(N) and the system memory 112. A memory controller 116 controls access to the system memory 112. For example, a CPU 104(0)-104(N) as a requesting device may issue a data request 118 to read data in response to processing a load instruction. The data request 118 includes a target address of the data to be read from memory. Using CPU 104(0) as an example, if the requested data is not in a private cache memory 114(1) (i.e., a cache miss to cache memory 114(1)) which may be considered a level one (L1) cache memory, the private cache memory 114(1) sends the data request 118 over an interconnect bus 120 in this example to a shared cache memory 114(X) shared with all of the CPUs 104(0)-104(N), which may be a level 3 (L3) cache memory. The requested data in the data request 118 is eventually either fulfilled in a cache memory 114(1)-114(X) or the system memory 112 if not contained in any of the cache memories 114(1)-114(X).

The cache memories 114(1)-114(X) and/or the system memory 112 in the memory system 108 in FIG. 1 can employ memory arrays that include memory bit cells typically organized in a row and column structure for storing data. A memory row that contains a memory bit cell in a respective column is accessed to read or write a data word from memory. The memory bit cells can be provided in different technologies of memory, such as static random access memory (RAM) (SRAM) bit cells, and DRAM. As another example, the system memory 112 may be implemented with multiple large sized memory arrays using multiple memory banks to improve memory performance and power consumption. Providing multiple memory banks in a memory in the memory system 108 can split the memory capacity among different arrays that can each be accessed independently by the CPUs 104(1)-104(N). Also, providing separate memory banks in the memory system 108 means that the power consumption can be managed for each memory bank independently of another memory bank. Thus for example, if software or data is persistent in one portion of memory, but not another, these separate portions of memory can be split into separate memory banks so that each can be separately powered down or idled to conserve power without affecting the other which may be fully powered for memory accesses.

Figure 2:
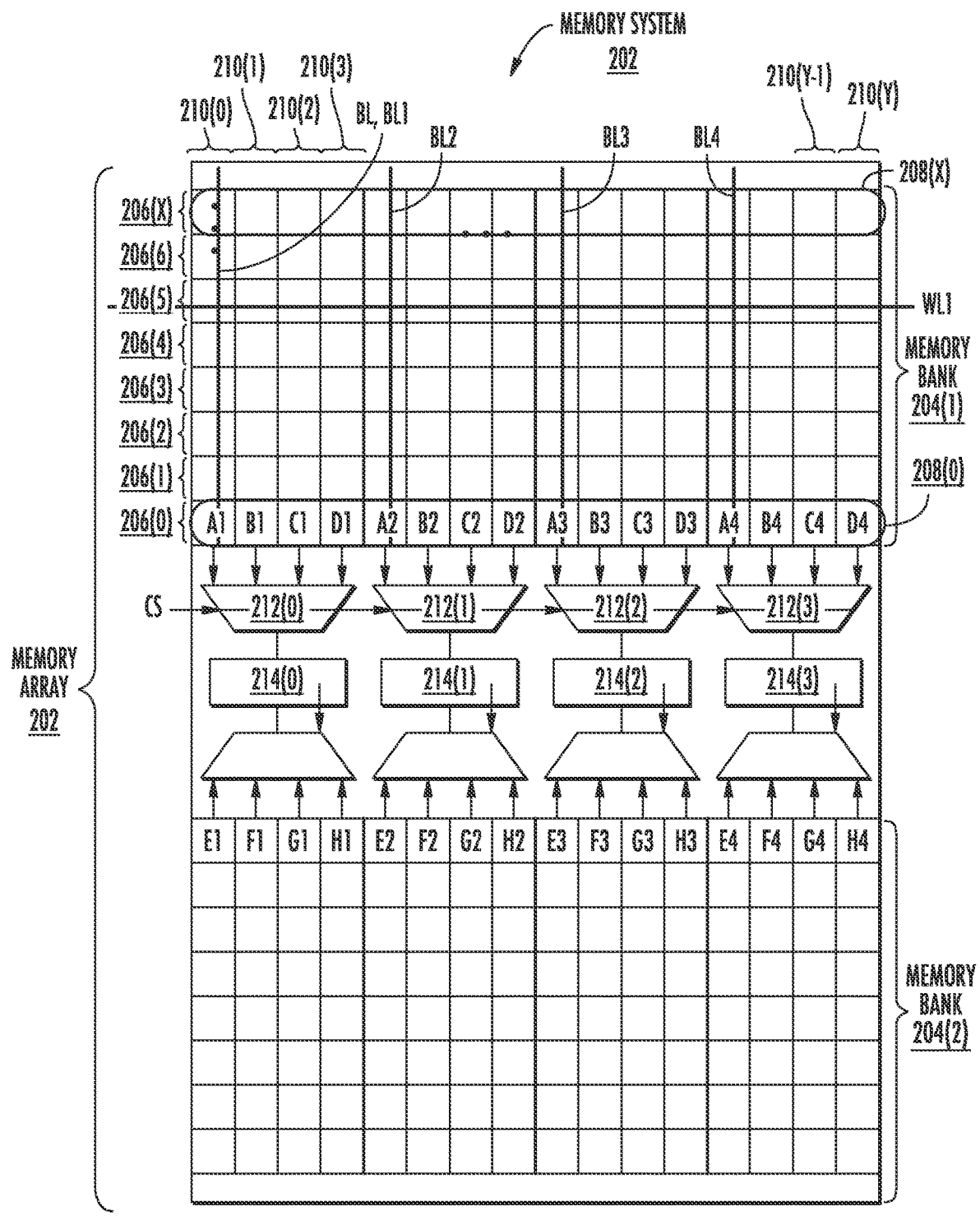
FIG. 2 is an exemplary four (4) column multiplexed (CM4) memory array.

FIG. 2 is an exemplary memory system 200 that includes a four (4) column multiplexed (CM4) memory array 202 that could be employed in any memory in the memory system 108 in FIG. 1 as an example. The memory array 202 in FIG. 2 does not include flying bit lines, and is described to illustrate a memory array 202 that does not employ flying bit lines.

In this regard, as shown in FIG. 2, the memory array 202 includes a first memory bank 204(1) and a second memory bank 204(2). The first memory sub-bank includes a plurality of first memory row circuits 206(0)-206(X) that each include a plurality of first memory bit cell circuits 208(0)-208(X). 'X+1' is the number of memory row circuits 206(0)-206(X). Each memory row circuit 206(0)-206(X) includes a respective set of memory bit cell circuits 208(0)-208(X). The sets of memory bit cell circuits 208(0)-208(X) in the respective memory row circuits 206(0)-206(X) in the first memory bank 204(1) are organized in memory column circuits 210(0)-210(Y); thus each set of memory bit cell circuits 208(0)-208(X) includes 'Y+1' memory bit cells. The first memory bank 204(1) has interleaved memory column circuits 210(0)-210(Y) configured to store interleaved data words A, B, C, D according to the interleaved memory column circuits labeled A1, B1, C1, D1, . . . , A4, B4, C4, D4. In this regard, the data word A1-A4 is interleaved across the memory column circuits 210(0)-210(Y) corresponding to the memory column circuits A1, A2, A3, A4. Interleaving the storage of data words in a memory array can reduce bit error rates (BERs).

When the first memory bank 204(1) is accessed in response to a memory read operation, a word line WL1 is activated for the selected memory row circuit 206(0)-206(X) according to a decoded memory address for the memory access operation. Then, a column select CS is generated to a plurality of column multiplexer circuits 212(0)-212(3) coupled to respective bit lines coupled to each of the memory bit cell circuits 208(0)-208(X) in the respective memory column circuits 210(0)-210(Y) representing an interleaved bit from the selected memory row circuit 206(0)-26(X). Each column multiplexer circuit 212(0)-212(3) couples one of the coupled bit lines from its coupled memory column circuits 210(0)-210(Y) to provide the corresponding bit to a respective memory column access circuit 214(0)-214(3) (e.g., sense amplifiers). In this manner, the column multiplexer circuits 212(0)-212(3) are controlled to multiplex a selected bit from an interleaved data word in a selected memory row circuit 206(0)-206(X) to a respective memory column access circuit 214(0)-214(3). For example, if it is desired to select interleaved data word A1-A4 from a selected memory row circuit 206(0)-206(X) in a memory read operation, the column multiplexer circuits 212(0)-212(3) are controlled by the column select CS to multiplex bits A1-A4 on respective bit lines BL1-BL4 from the selected memory row circuit 206(0)-208(X) to the respective memory column access circuits 214(0)-214(3). Thus, the first memory bank 204(1) is configured in a 4-bit column multiplex (CM4) arrangement in this example.

The second memory bank 204(2) is organized like the first memory bank 204(1). As shown in FIG. 2, the second memory bank 204(2) is designed to store interleaved data words E, F, G, and H according to the interleaved memory column circuits labeled E1, F1, G1, H1, . . . , E4, F4, G4, H4. The second memory bank 204(2) is also configured in a CM4 interleave arrangement. The operation of the second memory bank 204(2) is like that of the first memory bank 204(1) and thus is not described. Note that because the first and second memory banks 204(1), 204(2) are coupled to shared memory column access circuits 214(0)-214(3), only one memory bank among the first and second memory banks 204(1), 204(2) is accessed at one time.

It may be desired to increase the memory capacity of the memory array 202 in FIG. 2 to increase memory storage capacity. For example, one way to accomplish this is to increase the number of memory row circuits. Thus, using the first memory bank 204(1) as an example, the number of memory row circuits 206(0)-206(Y) could be increased, such as from 256 to 512 memory row circuits for example. However, extending the number of memory row circuits 206(0)-206(Y) would also extend the length of the corresponding bit lines (e.g., BL1-BL4) coupling each of the memory bit cell circuits 208(0)-208(X) in a corresponding memory column circuit 210(0)-210-(Y). Extending the length of the bit lines BLs in a memory bank 204(1), 204(2) in the memory array 202 may degrade power, performance, and area (PPA) of the memory system 200. Memories with longer bit lines BLs may have increased access latency as compared to memories with shorter bit lines BLs, because bit lines that are coupled the supporting access circuitry (e.g., write driver circuits and read sense circuits), are extended in length to reach the extended areas in the memory array. Thus, as an example, the overall memory access latency may increase by the access time to the memory bit cell circuits 208(0)-208(X) located in the memory row circuit 206(X) in the first memory bank 204(0) located farthest away from the supporting memory column access circuits 214(0)-214(3). Also, increasing the length of bit lines in a memory bank 204(1), 204(4) can also increase the capacitance on their respective bit lines thus increasing access latency. Fabrication design rules and related fabrication processes may also limit the overall length of bit lines in the memory array 202 of the memory system 200 thus effectively limiting the density of memory array 202 regardless of tradeoff acceptance of increased access latency.

FIG. 3 is an exemplary memory system 300 in an exemplary CM4 interleave arrangement that is similar to the memory system 200 in FIG. 2. However, as discussed below, the memory system 300 includes a memory array 302 that has increased memory density over the memory bank 204(2) in FIG. 2. In this regard, the memory array 302 in FIG. 3 includes a first memory sub-bank 304(1) of the memory density of the first memory bank 204(1) in the memory array 202 in FIG. 2. A memory bank is a local unit of memory storage (e.g., memory bit cells) that is controlled by a memory controller for read and write accesses. A memory bank comprises memory bit cell arrays and access circuits (e.g., write driver, sense amplifiers, column multiplexers, charging circuits, and write-assist circuits) used to address the bit cell arrays for read and write operations. If a memory is broken up into several memory banks, typically only one memory bank is accessible at a time to avoid data conflicts since the multiple memory banks typically share some common supporting access circuitry. A memory bank can also be split into multiple memory sub-banks. A memory sub-bank is a subdivision of memory bit cells from a memory bank. Memory sub-banks in a memory bank share common access circuitry with another memory sub-bank in its memory bank—thus only one memory sub-bank may be accessible within a memory bank at a given time.

The memory sub-bank 304(1) is coupled to column multiplexer circuits 312(0)-312(3) to multiplex data bits from the first memory sub-bank 304(1) to respective memory column access circuits 314(0)-314(3). The memory column access circuits 314(0)-314(3) are sense amplifier circuits in this example that can sense the memory state on signals on respective bit lines BL(1)(0)-BL(1)(Y) multiplexed to it from the respective column multiplexer circuits 312(0)-312(3). However, the memory array 302 in FIG. 3 also includes a second memory sub-bank 304(2) that is also coupled to the column multiplexer circuits 312(0)-312(3) to multiplex data bits from bit lines BL(2)(0)-BL(2)(Y) from the second memory sub-bank 304(3) to respective memory column access circuits 314(0)-314(3). The memory column access circuits 314(0)-314(3) can also sense the memory state on signals on respective bit lines BL(2)(0)-BL(2)(Y) multiplexed to it from the respective column multiplexer circuits 312(0)-312(3). In this manner, the memory density of the memory array 302 with its two (2) memory sub-banks 304(1), 304(2) that share the common column multiplexer circuits 312(0)-312(3) and memory column access circuits 314(0)-314(3) is increased. However, it is desired that the adding of the second memory sub-bank 304(2) does not increase the length of the bit lines of the first memory sub-bank 304(1).

In this regard, as shown in FIG. 3, the first, inner memory sub-bank 304(1) is located closer to the column multiplexer circuits 312(0)-312(3) and memory column access circuits 314(0)-314(3) than the second, outer memory sub-bank 304(2). The inner memory sub-bank 304(1) has X+1 number of memory row circuits 306(0)-306(X) that each include a plurality of memory bit cell circuits 308(0)(0)-308(X)(Y). For example, memory row circuit 306(0) includes Y+1 memory bit cell circuits 308(0)(0)-308(0)(Y). Memory row circuit 306(X) includes Y memory bit cell circuits 308(X)(0)-308(X)(Y). As a non-limiting example, the memory bit cell circuits 308(0)(0)-308(X)(Y) may be static random access memory (SRAM) bit cells, that employ a six (6) transistor (6-T) or greater transistor count. The memory bit cell circuits 308(0)(0)-308(X)(Y) could also be dynamic random access memory (DRAM) bit cells as another example. The organization of the memory bit cell circuits 308(0)(0)-308(X)(Y) is such that one memory bit cell circuit 3080(0)-3080(Y) from each memory row circuit 306(0)-306(X) is arranged in the same respective memory column circuit 310(0)-310(Y). Only memory column circuits 310(0), 310(Y) are labeled in FIG. 2. For example, there may be 256 memory column circuits 310(0)-310(255) provided in the inner memory sub-bank 304(1).

With continuing reference to FIG. 3, the inner memory sub-bank 304(1) includes Y number of first bit lines BL(1)(0)— BL(1)(Y) each coupled to the memory bit cell circuits 308(0)(0)-308(X)(Y) in a respective memory row circuit 306(0)-306(X). The first bit lines BL(1)(0)— BL(1)(Y) can be pre-charged to write data into memory bit cell circuits 308(0)(0)-308(X)(Y) in a selected memory row circuit 306(0)-306(Y) controlled by an activation of a word line WL by a memory driver circuit 318 for the selected memory row circuit 306(0)-306(X) according to a decoded memory address 316. Only one WL is shown in FIG. 3, but note that there is a separate WL provided for each memory row circuit 306(0)-306(X) that is coupled to each memory bit cell circuit 308(0)(0)-308(X)(Y) in its respective memory row circuit 306(0)-306(X). Only one of the WLs for a given memory row circuit 306(0)-306(X) is activated to select the memory row circuit 306(0)-306(X) for a memory access operation. The memory bit cell circuits 308(0)(0)-308(X)(Y) in a selected memory row circuit 306(0)-306(X) can also assert data onto a respective bit line BL(1)(0)— BL(1)(Y) for a memory read operation to be provided to the column multiplexer circuits 312(0)-312(3) and memory column access circuits 314(0)-314(3).

As discussed above, to increase the memory density of the memory array 302, the second, outer memory sub-bank 304(2) is also included in the memory system 300. The outer memory sub-bank 304(2) is located farther away from the column multiplexer circuits 312(0)-312(3) and memory column access circuits 314(0)-314(3) than the inner memory sub-bank 304(1). Like the inner memory sub-bank 304(1), the outer memory sub-bank 304(2) has X+1 number of memory row circuits 326(0)-326(X) that each include a plurality of memory bit cell circuits 328(0)(0)-328(X)(Y). For example, memory row circuit 326(0) includes Y+1 memory bit cell circuits 328(0)(0)-328(0)(Y). Memory row circuit 326(X) includes Y memory bit cell circuits 328(X)(0)-328(X)(Y). As a non-limiting example, the memory bit cell circuits 328(0)(0)-328(X)(Y) may be SRAM bit cells, that employ a six (6) transistor (6-T) or greater transistor count. The memory bit cell circuits 328(0)(0)-328(X)(Y) could also be DRAM bit cells as another example. The organization of the memory bit cell circuits 328(0)(0)-328(X)(Y) is such that one memory bit cell circuit 3280(0)-3280(Y) from each memory row circuit 326(0)-326(X) is arranged in the same respective memory column circuit 330(0)-330(Y). Only memory column circuits 330(0), 330(Y) are labeled in FIG. 3. For example, there may be 256 memory column circuits 330(0)-330(255) provided in the outer memory sub-bank 304(2).

With continuing reference to FIG. 3, the outer memory sub-bank 304(2) also includes Y number of second bit lines BL(2)(0)— BL(2)(Y) each coupled to the memory bit cell circuits 328(0)(0)-328(X)(Y) in a respective memory row circuit 326(0)-326(X). The second bit lines BL(2)(0)— BL(2)(Y) can be pre-charged to write data into memory bit cell circuits 328(0)(0)-328(X)(Y) in a selected memory row circuit 326(0)-326(Y) controlled by an activation of a word line WL by the memory driver circuit 318 for the selected memory row circuit 326(0)-326(X) according to the decoded memory address 316. Note that there is a separate WL provided for each memory row circuit 326(0)-326(X) that is coupled to each memory bit cell circuit 328(0)(0)-328(X)(Y) in its respective memory row circuit 326(0)-326(X). Only one of the WLs for a given memory row circuit 326(0)-326(X) in outer memory sub-bank 304(2) and memory row circuit 306(0)-306(X) in inner memory sub-bank 304(1) is activated to select either a memory row circuit 326(0)-326(X) or a memory row circuit 306(0)-306(X) for a memory access operation. The memory bit cell circuits 328(0)(0)-328(X)(Y) in a selected memory row circuit 326(0)-326(X) can also assert data onto a respective bit line BL(2)(0)-BL(2)(Y) for a memory read operation to be provided to the column multiplexer circuits 312(0)-312(3) and memory column access circuits 314(0)-314(3).

The first and second memory sub-banks 304(1), 304(2) are designed to store interleaved data words A, B, C, D according to the interleaved memory column circuits labeled A1, B1, C1, D1, . . . , A4, B4, C4, D4. Thus, the memory array 302 is also configured in a CM4 interleave arrangement. Thus, there are four (4) column multiplexer circuits 312(0)-312(3) in this example to support the CM4 interleave arrangement. There can be a number of column multiplexer circuits 312(0)-312(3) equal to or greater than two (2) to match the interleaving scheme.

When the inner or outer memory sub-banks 304(1), 304(2) are accessed in response to a memory read operation, a word line WL is activated for the selected memory row circuit 306(0)-306(X), 326(0)-326(X) according to the decoded memory address 316 for the memory access operation. The column select CS1 is generated to the column multiplexer circuits 312(0)-312(3) coupled to respective first and second bit lines BL(1)(0)-BL(1)(Y), BL(2)(0)-BL(2)(Y) coupled to the respective memory bit cell circuits 308(0)(0)-308(0)(Y), 328(0)(0)-328(0)(Y) in the respective memory column circuits 310(0)-310(Y), 330(0)-330(Y) representing an interleaved bit from the selected memory row circuit 306(0)-306(X), 326(0)-326(X). Each column multiplexer circuit 312(0)-312(3) couples one of the coupled first and second bit lines BL(1)(0)-BL(1)(Y), BL(2)(0)-BL(2)(Y) from its coupled memory column circuits 310(0)-310(Y), 330(0)-330(Y) to a respective multiplex output 320(0)-320(3) to provide the corresponding bit to a respective memory column access circuit 314(0)-314(3) (e.g., sense amplifiers). In this manner, the column multiplexer circuits 312(0)-312(3) are controlled to multiplex a selected bit from an interleaved data word in a selected memory row circuit 306(0)-306(X), 326(0)-326(X) according to a respective memory column access circuit 314(0)-314(3). The memory column access circuits 314(0)-314(3) are configured to provide bits of a data output word 324 on respective column outputs 322(0)-322(3) for a memory read operation.

For example, if it is desired to select interleaved data word A1-A4 from a selected memory row circuit 306(0)-306(X) in a memory read operation, the column multiplexer circuits 312(0)-312(3) are controlled by the column select CS1 to multiplex bits A1-A4 on respective first bit lines BL(1)(0), BL(1)(3), BL(1)(7), BL(1)(11) from the selected memory row circuit 306(0)-306(X) on the respective multiplex outputs 320(0)-302(3) to the respective memory column access circuits 314(0)-314(3). The memory column access circuits 314(0)-314(3) are configured to provide signals indicative of the read bits on the first bit lines BL(1)(0), BL(1)(3), BL(1)(7), BL(1)(11) onto respective column outputs 322(0)-322(3) as the data output word 324.

As shown in FIG. 3 and discussed above, the first and second bit lines BL(1)(0)-BL(1)(Y), BL(2)(0)-BL(2)(Y), are provided for each memory column circuit 310(0)-310(Y), 330(0)-330(Y) of the respective memory sub-banks 304(1), 304(2). The first bit lines BL(1)(0)-BL(1)(Y) could be extended in length to provide bit lines for each memory column circuit 330(0)-330(Y) of the outer memory sub-bank 304(2). For example, the first bit lines BL(1)(0)-BL(1)(Y) for the inner memory sub-bank 304(1) may extend in a first metal layer (e.g., M0 or M2) in or above the memory bit cell circuits 308(0)(0)-308(X)(Y). Extending the length of first bit lines BL(1)(0)-BL(1)(Y) would increase the capacitance of the first bit lines BL(1)(0)-BL(1)(Y) thus reducing memory performance to the memory array 302 in an undesired manner.

Thus, to avoid the need to have lengthen the first bit lines BL(1)(0)-BL(1)(Y) in the inner memory sub-bank 304(1) to provide bit lines for the outer memory sub-bank 304(2), the second bit lines BL(2)(0)-BL(2)(Y) for the outer memory sub-bank 304(2) in the memory system 300 in FIG. 3 are provided as separate bit lines. The second bit lines BL(2)(0)-BL(2)(Y) for the outer memory sub-bank 304(2) are distinct bit lines and are coupled to the respective column multiplexer circuits 312(0)-312(3) apart from the first bit lines BL(1)(0)-BL(1)(Y) for the inner memory sub-bank 304(1). However, a path must be provided between the second bit lines BL(2)(0)-BL(2)(Y) for the outer memory sub-bank 304(2) to the column multiplexer circuits 312(0)-312(3). The memory bit cell circuits 308(0)(0)-308(X)(Y) could be changed in design to accommodate a coupling of the second bit lines BL(2)(0)-BL(2)(Y) in additional metal line routing paths in the first metal layer that accommodates the first bit lines BL(1)(0)-BL(1)(Y) for the inner memory sub-bank 304(1) and extending through the inner memory sub-bank 304(2) to the column multiplexer circuits 312(0)-312(3) alongside the BL(1)(0)-BL(1)(Y). However, fabrication limitation may prevent or otherwise make it undesirable to change the cell design of all the memory bit cell circuits 308(0)(0)-308(X)(Y) to accommodate the coupling of first bit lines BL(1)(0)-BL(1)(Y) to the first metal layer to provide for additional metal line routing path for second bit lines BL(2)(0)-BL(2)(Y) alongside the first bit lines BL(1)(0)-BL(1)(Y).

In this regard as shown in FIG. 3, to avoid the need to both lengthen the first bit lines BL(1)(0)-BL(1)(Y) in the inner memory sub-bank 304(1) to extend to the outer memory sub-bank 304(2), jumper cell circuits 332(0)-332(Y) are provided. In this example, the outer most memory bit cell circuits 308(X)(0)-308(X)(Y) that are adjacent to the outer memory sub-bank 304(2) are provided as the jumper cell circuits 332(0)-332(Y). The jumper cell circuits 332(0)-332(Y) are each coupled to the second bit lines BL(2)(0)-BL(2)(Y) for the outer memory sub-bank 304(2) as well as the first bit lines BL(1)(0)-BL(1)(Y) for the inner memory sub-bank 304(1). The jumper cell circuits 332(0)-332(Y) each include respective metal interconnects 334(0)-334(Y) that couple respective second bit lines BL(2)(0)-BL(2)(Y) for the outer memory sub-bank 304(2) to respective flying bit lines FBL(0)-FBL(Y). In this example, the metal interconnects 334(0)-334(Y) of the respective jumper cell circuits 332(0)-332(2) couple respective to the second bit lines BL(2)(0)-BL(2)(Y) in the first metal layer for the outer memory sub-bank 304(2) to respective flying bit lines FBL(0)-FBL(Y) in a second metal layer ML2 (e.g., M4). For example, the second metal layer ML2 may be disposed in a higher metal layer than the first metal layer ML1 in which the first bit lines BL(1)(0)-BL(1)(Y) for the inner memory sub-bank 304(1) are disposed. In this manner, the flying bit lines FBL(0)-FBL(Y) can "fly over" the first metal layer ML1 in which the first bit lines BL(1)(0)-BL(1)(Y) for the inner memory sub-bank 304(1) are disposed in a vertical direction to be coupled to the respective column multiplexer circuits 312(1)-312(3).

To further illustrate exemplary details of routing the first bit lines BL(1)(0)-BL(1)(Y) for the inner memory sub-bank 304(1) and the flying bit lines FBL(0)-FBL(Y) coupled to the outer memory sub-bank 304(2) in separate metal layers, FIGS. 4A and 4B are provided. FIG. 4A is a top view of an exemplary layout of the first, lower metal layer ML1 of a portion of the memory array 302 in FIG. 3. FIG. 4A illustrates the metal lines for four (4) first bit lines BL(1)(0)-BL(1)(3) of the inner memory sub-bank 304(1) and four (4) second bit lines BL(2)(0)-BL(2)(3) of the outer memory sub-bank 304(2) in the first metal layer ML1. FIG. 4B is a top view of an exemplary layout of the second, upper metal layer ML2 of a portion of the memory array 302 in FIG. 3. FIG. 4B shows the coupling of the second bit lines BL(2)(0)-BL(2)(3) of the outer memory sub-bank 304(2) to the metal lines of the flying bit lines BLY(0)-BL(Y) routed in the second metal layer ML2 to the column multiplexer circuits 312(1)-312(3).

In this regard, as shown in FIG. 4A, the first bit lines BL(1)(0)-BL(1)(3) of the inner memory sub-bank 304(1) extend in the Y-axis direction in respective metal tracks MT0-MT3 in the first metal layer ML1 towards the column multiplexer circuit 312(0). The second bit lines BL(2)(0)-BL(2)(3) of the outer memory sub-bank 304(2) also extend in the Y-axis direction in respective metal tracks MT0-MT3 in the first metal layer ML1. As shown in FIG. 4A, the second bit lines BL(2)(0)-BL(2)(3) are coupled to respective jumper cell circuits 332(0)-332(Y) as part of the inner memory sub-bank 304(1). In this example, the jumper cell circuits 332(0)-332(Y) are directly adjacent to the outer memory sub-bank 304(2), but such is not required. The jumper cell circuits 332(0)-332(Y) have respective metal interconnects 334(0)-334(3) that are coupled to the second bit lines BL(2)(0)-BL(2)(3). The second bit lines BL(2)(0)-BL(2)(3) do not further extend towards the column multiplexer circuit 312(0) in the first metal layer ML1. Instead, as shown in FIG. 4B, the metal interconnects 334(0)-334(3) extend up to the second metal layer ML2 (such as through vias and metal lines) and are coupled to flying bit lines FBL(0)-FLB(3). The second metal layer ML2 includes metal tracks MT0-MT5 that extend in the Y-axis direction. The flying bit lines FBL(0)-FBL(3) extend in the Y-axis direction are provided as metal lines that are disposed in respective metal tracks MT0, MT1, MT4, MT5 in the first metal layer ML1 to extend to and be coupled to the column multiplexer circuit 312(0).

Thus, in this example, the flying bit lines FBL(0)-FBL(3) in the second metal layer ML2 extends over (i.e., fly over) the first bit lines BL(1)(0)-BL(1)(Y) in the first metal layer ML1. The flying bit lines FBL(0)-FBL(3) at least partially overlap the first bit lines BL(1)(0)-BL(1)(Y) in the vertical, Z-axis direction.

Note that the flying bit lines FBL(0)-FBL(Y) in the memory system 300 in FIG. 3 could also be routed in other manners other than as shown in FIGS. 4A and 4B. For example, as shown in the exemplary layout of the memory system 300 in FIG. 5, the flying bit lines FBL(0)-FBL(Y) could be routed back towards the outer memory row circuit 326(X) in the outer memory sub-bank 304(2) in a third metal layer ML3, which may be between first and second metal layers ML1, ML2. The flying bit lines FBL(0)-FBL(Y) could then be coupled to metal lines in the second metal layer ML2 to be routed to the column multiplexer circuits 312(0)-312(Y).

FIG. 6 is another exemplary memory system 600 that includes a memory array 602 that is similar to the memory system 300 in FIG. 3. However, in the memory system 600 in FIG. 6, two additional memory sub-banks, inner memory sub-bank 604(1) and outer memory sub-bank 604(2) are provided to further increase the size of the memory array 602. The inner and outer memory sub-banks 304(1), 304(2) that are coupled to the respective column multiplexer circuits 312(0)-312(3) and memory column access circuits 314(0)-314(3) are provided, and thus are not re-described. Also, in this example, as discussed below, the memory array 602 is organized in a eight (8) column multiplexed (CM8) arrangement, such that to read out memory word A for example, one of the memory sub-banks 304(1), 304(2) and one of the memory sub-banks 604(1), 604(2) will be accessed thus requiring two (2) word lines WL1, WL2 to be activated. Also, in this example, as discussed below, like the inner memory sub-bank 304(1), the inner memory sub-bank 604(1) includes respective jumper cell circuits 632(0)-632(Y) that are coupled to second bit lines BL(4)(0)-BL(4)(Y) of the outer memory sub-bank 604(2) and are also coupled to second flying bit lines SFBL(0)-SFBL(Y) coupled to respective column multiplexer circuits 612(0)-612(3) that are also coupled to the shared memory column access circuits 314(0)-314(3).

With reference to FIG. 6, inner memory sub-bank 604(1) is located closer to the column multiplexer circuits 612(0)-612(3) and memory column access circuits 314(0)-314(3) than the outer memory sub-bank 604(2). The inner memory sub-bank 604(1) has X+1 number of memory row circuits 606(0)-606(X) that each include a plurality of memory bit cell circuits 608(0)(0)-608(X)(Y). Memory row circuit 306(X) includes Y memory bit cell circuits 308(X)(0)-308(X)(Y). As a non-limiting example, the memory bit cell circuits 608(0)(0)-608(X)(Y) may be static random access memory (SRAM) bit cells, that employ a six (6) transistor (6-T) or greater transistor count. The memory bit cell circuits 608(0)(0)-608(X)(Y) could also be dynamic random access memory (DRAM) bit cells as another example. The organization of the memory bit cell circuits 608(0)(0)-608(X)(Y) is such that one memory bit cell circuit 6080(0)-6080(Y) from each memory row circuit 606(0)-606(X) is arranged in the same respective memory column circuit 610(0)-610(Y). Only memory column circuits 610(0), 610(Y) are labeled in FIG. 6. For example, there may be 256 memory column circuits 610(0)-610(255) provided in the inner memory sub-bank 604(1).

With continuing reference to FIG. 6, the inner memory sub-bank 604(1) includes Y number of first bit lines BL(3)(0)— BL(3)(Y) each coupled to the memory bit cell circuits 608(0)(0)-608(X)(Y) in a respective memory row circuit 606(0)-606(X). The first bit lines BL(3)(0)— BL(3)(Y) can be pre-charged to write data into memory bit cell circuits 608(0)(0)-608(X)(Y) in a selected memory row circuit 606(0)-606(Y) controlled by an activation of a word line WL2 for the selected memory row circuit 606(0)-606(X) according to the decoded memory address 316. Note that there is a separate WL provided for each memory row circuit 606(0)-606(X) that is coupled to each memory bit cell circuit 608(0)(0)-608(X)(Y) in its respective memory row circuit 606(0)-606(X). Only one of the WLs for a given memory row circuit 606(0)-606(X) in outer memory sub-bank 604(2) is activated to select a memory row circuit 606(0)-606(X) for a memory access operation. The memory bit cell circuits 608(0)(0)-608(X)(Y) in a selected memory row circuit 606(0)-606(X) can also assert data onto a respective bit line BL(3)(0)— BL(3)(Y) for a memory read operation to be provided to the column multiplexer circuits 612(0)-612(3) and memory column access circuits 314(0)-314(3).

The outer memory sub-bank 604(2) is located farther away from the column multiplexer circuits 612(0)-612(3) and memory column access circuits 314(0)-314(3) than the inner memory sub-bank 604(1). Like the inner memory sub-bank 604(1), the outer memory sub-bank 604(2) has X+1 number of memory row circuits 626(0)-626(X) that each include a plurality of memory bit cell circuits 628(0)(0)-628(X)(Y). As a non-limiting example, the memory bit cell circuits 628(0)(0)-628(X)(Y) may be SRAM bit cells, that employ a six (6) transistor (6-T) or greater transistor count. The memory bit cell circuits 628(0)(0)-628(X)(Y) could also be DRAM bit cells as another example. The organization of the memory bit cell circuits 628(0)(0)-628(X)(Y) is such that one memory bit cell circuit 6280(0)-6280(Y) from each memory row circuit 626(0)-626(X) is arranged in the same respective memory column circuit 630(0)-630(Y). Only memory column circuits 630(0), 630(Y) are labeled in FIG. 2. For example, there may be 256 memory column circuits 630(0)-630(255) provided in the outer memory sub-bank 604(2).

With continuing reference to FIG. 6, the outer memory sub-bank 604(2) also includes Y number of second bit lines BL(4)(0)— BL(4)(Y) each coupled to the memory bit cell circuits 628(0)(0)-628(X)(Y) in a respective memory row circuit 626(0)-626(X). The second bit lines BL(4)(0)— BL(4)(Y) can be pre-charged to write data into memory bit cell circuits 628(0)(0)-628(X)(Y) in a selected memory row circuit 626(0)-626(Y) controlled by an activation of the word line WL2 for the selected memory row circuit 626(0)-626(X) according to the decoded memory address 316. Note that there is a separate WL provided for each memory row circuit 626(0)-626(X) that is coupled to each memory bit cell circuit 628(0)(0)-628(X)(Y) in its respective memory row circuit 626(0)-626(X). Only one of the WLs for a given memory row circuit 626(0)-626(X) in outer memory sub-bank 604(2) and memory row circuit 606(0)-606(X) in inner memory sub-bank 604(1) is activated to select either a memory row circuit 626(0)-626(X) or a memory row circuit 606(0)-606(X) for a memory access operation. The memory bit cell circuits 628(0)(0)-628(X)(Y) in a selected memory row circuit 626(0)-626(X) can also assert data onto a respective bit line BL(4)(0)-BL(4)(Y) for a memory read operation to be provided to the column multiplexer circuits 612(0)-612(3) and memory column access circuits 314(0)-314(3).

The memory sub-banks 304(1), 304(2), 604(1), 604(2) are designed to store interleaved data words A, B, C, D, E, F, G, H according to the interleaved memory column circuits labeled A1, B1, C1, D1, E1, F1, G1, H1, . . . , A4, B4, C4, D4, E4, F4, G4, H4. Thus, the memory array 602 is also configured in a CM8 interleave arrangement. Thus, there are eight (8) column multiplexer circuits 312(0)-312(3), 612(0)-612(3) in this example to support the CM8 interleave arrangement. There can be a number of column multiplexer circuits 312(0)-312(3), 612(0)-612(3) equal to or greater than two (2) to match the interleaving scheme.

When the inner or outer memory sub-banks 604(1), 604(2) are accessed in response to a memory read operation, a word line WL is activated for the selected memory row circuit 606(0)-606(X), 626(0)-626(X) according to the decoded memory address 316 for the memory access operation. The column select CS2 is generated to the column multiplexer circuits 612(0)-612(3) coupled to respective first and second bit lines BL(1)(0)-BL(1)(Y), BL(2)(0)-BL(2)(Y) coupled to the respective memory bit cell circuits 608(0)(0)-608(0)(Y), 628(0)(0)-628(0)(Y) in the respective memory column circuits 610(0)-610(Y), 630(0)-630(Y) representing an interleaved bit from the selected memory row circuit 606(0)-606(X), 626(0)-626(X). Each column multiplexer circuit 612(0)-612(3) couples one of the coupled first and second bit lines BL(1)(0)-BL(1)(Y), BL(2)(0)-BL(2)(Y) from its coupled memory column circuits 610(0)-610(Y), 630(0)-630(Y) to a respective multiplex output 620(0)-620(3) to provide the corresponding bit to a respective memory column access circuit 314(0)-314(3) (e.g., sense amplifiers). In this manner, the column multiplexer circuits 612(0)-612(3) are controlled to multiplex a selected bit from an interleaved data word in a selected memory row circuit 606(0)-606(X), 626(0)-626(X) according to a respective memory column access circuit 314(0)-314(3). The memory column access circuits 314(0)-314(3) are configured to provide bits of a data output word 324 on respective column outputs 322(0)-322(3) for a memory read operation (see FIG. 3).

For example, if it is desired to select interleaved data word A1-A4 from the memory array 602 in a memory read operation, two memory read operations are performed. First, a first word line WL1 is activated in a first operation to select the desired memory row circuit 306(0)-306(X), 326(0)-326(X). The column multiplexer circuits 312(0), 312(2) are controlled by the column select CS1 to multiplex bits A1, A3 on respective first bit lines BL(1)(0), BL(1)(7) from the selected memory row circuit 306(0)-306(X) according to the activated word line WL1 on the respective multiplex outputs 320(0), 320(2) to the respective memory column access circuits 314(0), 314(2). The memory column access circuits 314(0), 314(2) are configured to provide signals indicative of the read bits on the first bit lines BL(1)(0), BL(1)(2) for A1, A3 onto respective column outputs 322(0), 322(2) as part of the data output word 324. Then, in a second access operation, a second word line WL2 is activated to select the desired memory row circuit 606(0)-606(X), 626(0)-626(X). The column multiplexer circuits 612(1), 612(3) are controlled by the column select CS2 to multiplex bits A2, A4 on respective first bit lines BL(3)(1), BL(3)(3) from the selected memory row circuit 606(0)-606(X) according to the activated word line WL2 on the respective multiplex outputs 620(1), 620(3) to the respective memory column access circuits 314(1), 314(3). The memory column access circuits 314(1), 314(3) are configured to provide signals indicative of the read bits on the first bit lines BL(3)(4), BL(3)(11) for A1, A3 onto respective column outputs 622(0), 622(2) as the data output word 324.

Note that in a memory read access, the activating of the respective word lines WL1 and WL2 will cause all the memory bit cell circuits in a selected memory row circuit to be activated and data from their respective bit lines coupled to the respective column multiplexer circuits 312(0)-312(3), 612(0)-612(3). Thus, only one word line between word lines WL1, WL2 is activated at a time so that the memory column access circuits 314(1), 314(3) can be shared. Even though activating two separate word lines WL1, WL2 for a memory read operation into the memory array 602 will activate twice as many memory bit cell circuits as only activating one word line for a memory operation like in the memory system 300 in FIG. 3, the memory density of the memory array 602 in FIG. 6 in this example is twice the memory density of the memory array 302 in FIG. 3. Thus, the power consumption normalized to a per density basis in the memory array 602 in FIG. 6 is still approximately the same as the memory array 302 in FIG. 3.

With continuing reference to FIG. 6, the first and second bit lines BL(3)(0)-BL(3)(Y), BL(4)(0)-BL(4)(Y), are provided for each memory column circuit 610(0)-610(Y), 630(0)-630(Y) of the respective memory sub-banks 604(1), 604(2). The first bit lines BL(3)(0)-BL(3)(Y) could be extended in length to provide bit lines for each memory column circuit 630(0)-630(Y) of the outer memory sub-bank 604(2). For example, the first bit lines BL(1)(0)-BL(1)(Y) for the inner memory sub-bank 604(1) may extend in a first metal layer (e.g., M0 or M2) in or above the memory bit cell circuits 608(0)(0)-608(X)(Y). Extending the length of first bit lines BL(3)(0)-BL(3)(Y) would increase the capacitance of the first bit lines BL(3)(0)-BL(3)(Y) thus reducing memory performance to the memory array 602 in an undesired manner.

Thus, to avoid the need to have to lengthen the first bit lines BL(3)(0)-BL(3)(Y) in the inner memory sub-bank 604(1) to provide bit lines for the outer memory sub-bank 604(2), the second bit lines BL(4)(0)-BL(4)(Y) for the outer memory sub-bank 604(2) in the memory system 600 in FIG. 6 are provided as separate bit lines. The second bit lines BL(4)(0)-BL(4)(Y) for the outer memory sub-bank 604(2) are distinct bit lines and are coupled to the respective column multiplexer circuits 612(0)-612(3) apart from the first bit lines BL(3)(0)-BL(3)(Y) for the inner memory sub-bank 604(1). However, a path must be provided between the second bit lines BL(4)(0)-BL(4)(Y) for the outer memory sub-bank 604(2) to the column multiplexer circuits 612(0)-612(3). The memory bit cell circuits 608(0)(0)-608(X)(Y) could be changed in design to accommodate a coupling of the second bit lines BL(4)(0)-BL(4)(Y) in additional metal line routing paths in the first metal layer that accommodates the first bit lines BL(3)(0)-BL(3)(Y) for the inner memory sub-bank 604(1) and extending through the inner memory sub-bank 604(2) to the column multiplexer circuits 612(0)-612(3) alongside the BL(3)(0)-BL(3)(Y). However, fabrication limitation may prevent or otherwise make it undesirable to change the cell design of all the memory bit cell circuits 608(0)(0)-608(X)(Y) to accommodate the coupling of first bit lines BL(3)(0)-BL(3)(Y) to the first metal layer to provide for additional metal line routing path for second bit lines BL(4)(0)-BL(4)(Y) alongside the first bit lines BL(3)(0)-BL(3)(Y).

In this regard as shown in FIG. 6, to avoid the need to lengthen the first bit lines BL(3)(0)-BL(3)(Y) in the inner memory sub-bank 604(1) to extend to the outer memory sub-bank 604(2), jumper cell circuits 632(0)-632(Y) are provided that can be like the jumper cell circuits 332(0)-332(Y) in the memory array 302 in FIG. 3. In this example, the outer most memory bit cell circuits 608(X)(0)-608(X)(Y) that are adjacent to the outer memory sub-bank 604(2) are provided as the jumper cell circuits 632(0)-632(Y). The jumper cell circuits 632(0)-632(Y) are each coupled to the second bit lines BL(4)(0)-BL(4)(Y) for the outer memory sub-bank 604(2) as well as the first bit lines BL(3)(0)-BL(3)(Y) for the inner memory sub-bank 604(1). The jumper cell circuits 632(0)-632(Y) each include respective metal interconnects 634(0)-634(Y) that couple respective second bit lines BL(4)(0)-BL(4)(Y) for the outer memory sub-bank 604(2) to respective second flying bit lines SFBL(0)-SFBL(Y). In this example, the metal interconnects 634(0)-634(Y) of the respective jumper bit cell circuits 632(0)-632(2) couple respective the second bit lines BL(4)(0)-BL(4)(Y) in the first metal layer for the outer memory sub-bank 604(2) to respective flying bit lines SFBL(0)-SFBL(Y) in a second metal layer ML2 (e.g., ML4). For example, the second metal layer ML2 may be disposed in a higher metal layer than the first metal layer ML1 in which the first bit lines BL(3)(0)-BL(3)(Y) for the inner memory sub-bank 304(1) are disposed. In this manner, the second flying bit lines SFBL(0)-SFBL(Y) can "fly over" the first metal layer ML1 in which the first bit lines BL(3)(0)-BL(3)(Y) for the inner memory sub-bank 604(1) are disposed in a vertical direction to be coupled to the respective column multiplexer circuits 612(1)-612(3).

The metal layer layout examples in FIGS. 4A-5 may also be applied to the first bit lines BL(3)(0)-BL(3)(Y), the second bit lines BL(4)(0)-BL(4)(Y), and the second flying bit lines SFBL(0)-SFBL(Y) in the inner and outer memory sub-banks 604(1), 604(2) in the memory array 602 in FIG. 6.

Note that the memory arrays described herein, including memory arrays 302 and 602 in FIGS. 3 and 6, that includes a first and second memory sub-banks to increase memory density, and wherein the memory array further includes flying bit lines coupling access circuitry to second bit lines in the second memory sub-bank to increase effective bit line length for supporting higher performance, without having to extend the length of first bit lines in the first memory sub-array, can be provided as other column multiplexed arrangements, including but not limited to CM16, CM32, etc.

FIG. 7 is a block diagram of an exemplary processor-based system 700 that includes a processor 702 configured to execute computer instructions for execution. The processor-based system also includes a memory system 704 that includes one or more memory arrays that includes a first and second memory sub-banks to increase memory density, and wherein the memory array further includes flying bit lines coupling access circuitry to second bit lines in the second memory sub-bank to increase effective bit line length for supporting higher performance, without having to extend the length of first bit lines in the first memory sub-array. The memory system 704 in this example includes an instruction cache 706, a data cache 708, and a system memory 710. Any memories in the memory system 704 in FIG. 7 could include the memory arrays 302, 602 in FIGS. 3 and 6, as non-limiting examples.

With continuing reference to FIG. 7, the processor-based system 700 may be a circuit or circuits included in an electronic board card, such as, a printed circuit board (PCB), a server, a personal computer, a desktop computer, a laptop computer, a personal digital assistant (PDA), a computing pad, a mobile device, or any other device, and may represent, for example, a server or a user's computer. The processor 702 represents one or more general-purpose processing circuits, such as a microprocessor, central processing unit, or the like. The processor 702 includes an instruction processing circuit 709 configured to execute processing logic in computer instructions for performing the operations and steps discussed herein. The processor 702 also includes the instruction cache 706 for temporary, fast access memory storage of instructions. Fetched or prefetched instructions from a memory, such as from a system memory 710 over a system bus 712, are stored in the instruction cache 706. The processor 702 also includes a data cache 708 for temporary, fast access memory storage of data from the system memory 710 over the system bus 712.

The processor 702 and the system memory 710 are coupled to the system bus 712 and can intercouple peripheral devices included in the processor-based system 700. As is well known, the processor 702 communicates with these other devices by exchanging address, control, and data information over the system bus 712. For example, the processor 702 can communicate bus transaction requests to a memory controller 714 in the system memory 710 as an example of a slave device. Although not illustrated in FIG. 7, multiple system buses 712 could be provided, wherein each system bus constitutes a different fabric. In this example, the memory controller 714 is configured to provide memory access requests to a memory array 716 in the system memory 710. The memory array 716 is comprised of an array of storage bit cells for storing data. The system memory 710 may be a read-only memory (ROM), flash memory, dynamic random access memory (DRAM), such as synchronous DRAM (SDRAM), etc., and a static memory (e.g., flash memory, static random access memory (SRAM), etc.), as non-limiting examples.

Other devices can be connected to the system bus 712. As illustrated in FIG. 7, these devices can include the system memory 710, one or more input device(s) 718, one or more output device(s) 720, a modem 722, and one or more display controllers 724, as examples. The input device(s) 718 can include any type of input device, including but not limited to input keys, switches, voice processors, etc. The output device(s) 720 can include any type of output device, including but not limited to audio, video, other visual indicators, etc. The modem 722 can be any device configured to allow exchange of data to and from a network 726. The network 726 can be any type of network, including but not limited to a wired or wireless network, a private or public network, a local area network (LAN), a wireless local area network (WLAN), a wide area network (WAN), a BLUETOOTH™ network, and the Internet. The modem 722 can be configured to support any type of communications protocol desired. The processor 702 may also be configured to access the display controller(s) 724 over the system bus 712 to control information sent to one or more displays 728. The display(s) 728 can include any type of display, including but not limited to a cathode ray tube (CRT), a liquid crystal display (LCD), a plasma display, etc.

The processor-based system 700 in FIG. 7 may include a set of instructions 730 that when executed by a processor, such as processor 702, generates a GBL clock signal and local WL clock signal locally within a memory bank that controls the timing of the respective GBL control path and a WL path in a selected memory row circuit in the memory bank. The instructions 730 may be stored in the system memory 710, processor 702, and/or instruction cache 706 as examples of non-transitory computer-readable medium 732. The instructions 730 may also reside, completely or at least partially, within the system memory 710 and/or within the processor 702 during their execution. The instructions 730 may further be transmitted or received over the network 726 via the modem 722, such that the network 726 includes the non-transitory computer-readable medium 732, or the input device 718 as other examples.

While the non-transitory computer-readable medium 732 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding, or carrying a set of instructions for execution by the processing device and that cause the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory (RAM), a magnetic disk storage medium, an optical storage medium, flash memory devices, etc.) and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the computer system memories, registers, or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium, and executed by a processor or other processing device, or combinations of both. The components of the distributed antenna systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be referenced throughout the above description, may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations, and variations of the disclosed embodiments incorporating the spirit and substance of the invention may occur to persons skilled in the art, the invention should be construed to include everything within the scope of the appended claims and their equivalents.

What is claimed is:

1. A memory system, comprising:
   a memory column access circuit; and
   a memory array, comprising:
      a first metal layer;
      a second metal layer different from the first metal layer, the second metal layer comprising a plurality of flying bit lines each coupled to the memory column access circuit;
      a first memory sub-bank, comprising:
         a plurality of first memory row circuits each comprising a plurality of first memory bit cell circuits each located in a respective first memory column circuit of a plurality of first memory column circuits; and
         a plurality of first bit lines disposed in the first metal layer and each coupled to a first memory column circuit of the plurality of first memory column circuits, and the memory column access circuit; and
      a second memory sub-bank, comprising:
         a plurality of second memory row circuits each comprising a plurality of second memory bit cell circuits each located in a respective second memory column circuit of a plurality of second memory column circuits; and
         a plurality of second bit lines each disposed in the first metal layer and each coupled to a second memory column circuit of the plurality of second memory column circuits; and
         a first jumper row circuit comprising a plurality of first jumper cell circuits each coupled to a second bit line of the plurality of second bit lines in a second memory column circuit of the plurality of second memory column circuits in the first metal layer, and a first flying bit line of the plurality of first flying bit lines in the second metal layer.

2. The memory system of claim 1, wherein each first jumper cell circuit of the plurality of first jumper cell circuits comprises a metal interconnect coupling the second bit line in the first metal layer to the first flying bit line in the second metal layer.

3. The memory system of claim 1, wherein:
   the first metal layer comprises a plurality of first metal tracks each comprising a first bit line of the plurality of first bit lines; and
   the second metal layer comprises a plurality of second metal tracks each comprising a first flying bit line of the plurality of first flying bit lines, and each at least partially overlapping a first metal track of the plurality of first metal tracks in a vertical direction.

4. The memory system of claim 1, wherein a first memory row circuit of the plurality of first memory row circuits comprises the plurality of first jumper cell circuits.

5. The memory system of claim 1, wherein the first memory row circuit comprises the plurality of first jumper cell circuits is adjacent to the second memory sub-bank.

6. The memory system of claim 1, wherein the plurality of first flying bit lines extends over each of the plurality of first memory row circuits and each of the plurality of second memory row circuits in a vertical direction.

7. The memory system of claim 1, wherein:
   the plurality of first memory row circuits comprises at least two hundred fifty-six (256) memory row circuits; and
   the plurality of second memory row circuits comprises at least two hundred fifty-six (256) memory row circuits.

8. The memory system of claim 1, further comprising:
   a plurality of first word lines (WLs) each coupled a first memory row circuit of the plurality of first memory row circuits;
   a plurality of second WLs each coupled to a second memory row circuit of the plurality of second memory row circuits; and
   a memory driver circuit coupled to the plurality of first WLs and the plurality of second WLs;
   the memory driver circuit configured to:
      receive a memory access request comprising a memory address; and
      in response to the memory access request, activate one of a first WL of the plurality of first WLs and a second WL of the plurality of second WLs, in response to the memory address corresponding to a respective one of:
         the first memory row circuit of the plurality of first memory row circuits coupled to the activated first WL; and
         the second memory row circuit of the plurality of second memory row circuits coupled to the activated second WL.

9. The memory system of claim 8, wherein:
   the memory column access circuit comprises:
      a plurality of column multiplexer circuits each coupled to a unique set of the plurality of first bit lines, and each coupled to a unique set of X number of the plurality of first flying bit lines, wherein 'X' is a positive integer greater than or equal to two (2);
      the plurality of column multiplexer circuits each configured to multiplex a bit line among coupled set of first bit lines and the coupled set of first flying bit lines to a corresponding multiplex output; and
   the memory driver circuit further configured to, in response to the memory access request:
      cause each column multiplexer circuit of the plurality of column multiplexer circuits to multiplex a bit line among its coupled X first bit lines and its coupled X first flying bit lines to its corresponding multiplex output.

10. The memory system of claim 9, further comprising a plurality of sense amplifiers each coupled to a multiplex output of a column multiplexer circuit of the plurality of column multiplexer circuits.

11. The memory system of claim 9, wherein X is equal to four (4).

12. The memory system of claim 9, wherein X is equal to eight (8).

13. The memory system of claim 1, wherein the memory array further comprises:
a third metal layer;
a fourth metal layer different from the third metal layer, the fourth metal layer comprising a plurality of second flying bit lines each coupled to the memory column access circuit;
a third memory sub-bank, comprising:
a plurality of third memory row circuits each comprising a plurality of third memory bit cell circuits each located in a respective third memory column circuit of a plurality of third memory column circuits; and
a plurality of third bit lines disposed in the third metal layer and each coupled to a third memory column circuit of the plurality of third memory column circuits, and the memory column access circuit;
a fourth memory sub-bank, comprising:
a plurality of fourth memory row circuits each comprising a plurality of fourth memory bit cell circuits each located in a respective fourth memory column circuit of a plurality of fourth memory column circuits; and
a plurality of fourth bit lines each disposed in the fourth metal layer and each coupled to a fourth memory column circuit of the plurality of fourth memory column circuits; and
a third memory row circuit of the plurality of third memory row circuits, comprising:
a plurality of second jumper cell circuits each coupled to a fourth bit line of the plurality of fourth bit lines in a fourth memory column circuit of the plurality of fourth memory column circuits in the third metal layer, and a first flying bit line of the plurality of first flying bit lines in the fourth metal layer.

14. The memory system of claim 13, wherein:
the first metal layer comprises the third metal layer; and
the second metal layer comprises the fourth metal layer.

15. The memory system of claim 13, wherein:
the third metal layer comprises a plurality of third metal tracks each comprising a third bit line of the plurality of third bit lines; and
the fourth metal layer comprises a plurality of fourth metal tracks each comprising a second flying bit line of the plurality of second flying bit lines, and each at least partially overlapping a third metal track of the plurality of third metal tracks in a vertical direction.

16. The memory system of claim 13, further comprising:
a plurality of first word lines (WLs) each coupled a first memory row circuit of the plurality of first memory row circuits;
a plurality of second WLs each coupled to a second memory row circuit of the plurality of second memory row circuits;
a plurality of third WLs each coupled a third memory row circuit of the plurality of third memory row circuits;
a plurality of fourth WLs each coupled to a fourth memory row circuit of the plurality of fourth memory row circuits; and
a memory driver circuit coupled to the plurality of first WLs, the plurality of second WLs, the plurality of third WLs and the plurality of fourth WLs;
the memory driver circuit configured to:
receive a memory access request comprising a memory address corresponding to one of the first memory sub-bank and the second memory sub-bank; and
in response to the memory access request to the first memory sub-bank:
activate one of a first WL of the plurality of first WLs and a second WL of the plurality of second WLs, in response to the memory address corresponding to a respective one of:
the first memory row circuit of the plurality of first memory row circuits coupled to the activated first WL; and
the second memory row circuit of the plurality of second memory row circuits coupled to the activated second WL; and
in response to the memory access request to the second memory sub-bank:
activate one of a third WL of the plurality of third WLs and a fourth WL of the plurality of fourth WLs, in response to the memory address corresponding to a respective one of:
the third memory row circuit of the plurality of third memory row circuits coupled to the activated third WL; and
the fourth memory row circuit of the plurality of fourth memory row circuits coupled to the activated fourth WL.

17. The memory system of claim 16, wherein:
the memory column access circuit comprises:
a plurality of first column multiplexer circuits each coupled to a unique set of the plurality of first bit lines, and each coupled to a unique set of X number of the plurality of first flying bit lines, wherein 'X' is a positive integer greater than or equal to two (2);
the plurality of first column multiplexer circuits each configured to multiplex a first bit line among the coupled set of first bit lines and the coupled set of first flying bit lines to a corresponding first multiplex output; and
a plurality of second column multiplexer circuits each coupled to a unique set of the plurality of third bit lines, and each coupled to a unique set of X number of the plurality of second flying bit lines, wherein 'X' is a positive integer greater than or equal to two (2);
the plurality of second column multiplexer circuits each configured to multiplex a second bit line among the coupled set of third bit lines and the coupled set of second flying bit lines to a corresponding second multiplex output;
the memory driver circuit further configured to:
in response to the memory access request to the first memory sub-bank:
cause each first column multiplexer circuit of the plurality of first column multiplexer circuits to multiplex a first bit line among its coupled X first bit lines and its coupled X first flying bit lines to its corresponding first multiplex output; and
in response to the memory access request to the first memory sub-bank:
cause each second column multiplexer circuit of the plurality of second column multiplexer circuits to multiplex a second bit line among its coupled X third bit lines and its coupled X second flying bit lines to its corresponding second multiplex output.

18. The memory system of claim 17, further comprising a plurality of sense amplifiers each coupled to a first multiplex output of a first column multiplexer circuit of the plurality of first column multiplexer circuits, and to a second multiplex output of a second column multiplexer circuit of the plurality of second column multiplexer circuits.

19. The memory system of claim 17, wherein X is equal to eight (8).

* * * * *